US012575402B2

(12) United States Patent
Lanzillo et al.

(10) Patent No.: US 12,575,402 B2
(45) Date of Patent: Mar. 10, 2026

(54) NON-PLANAR METAL-INSULATOR-METAL STRUCTURE

(71) Applicant: INTERNATIONAL BUSINESS MACHINES CORPORATION, Armonk, NY (US)

(72) Inventors: Nicholas Anthony Lanzillo, Wynantskill, NY (US); Reinaldo Vega, Mahopac, NY (US); Takashi Ando, Eastchester, NY (US); David Wolpert, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 661 days.

(21) Appl. No.: 17/933,078

(22) Filed: Sep. 16, 2022

(65) Prior Publication Data
US 2024/0096793 A1 Mar. 21, 2024

(51) Int. Cl.
| *H01L 23/528* | (2006.01) |
| *H01L 21/02* | (2006.01) |
| *H01L 21/306* | (2006.01) |
| *H01L 23/48* | (2006.01) |
| *H01L 23/522* | (2006.01) |

(52) U.S. Cl.
CPC ...... *H01L 23/5283* (2013.01); *H01L 21/0226* (2013.01); *H01L 21/30604* (2013.01); *H01L 23/481* (2013.01); *H01L 23/5226* (2013.01)

(58) Field of Classification Search
CPC ............... H01L 23/5283; H01L 23/481; H01L 23/5226; H01L 21/0226; H01L 21/30604

USPC ......................................................... 257/734
See application file for complete search history.

(56) References Cited

U.S. PATENT DOCUMENTS

| 7,160,772 B2 | 1/2007 | Coolbaugh et al. |
| 8,357,609 B2 | 1/2013 | Ryan |
| 9,368,392 B2 | 6/2016 | Tseng et al. |
| 9,502,350 B1 | 11/2016 | Bonilla et al. |
| 9,960,164 B2 * | 5/2018 | Cheng ............... H01L 21/76895 |
| 10,090,378 B1 | 10/2018 | Chung et al. |
| 10,177,031 B2 | 1/2019 | Bao et al. |
| 10,256,186 B2 | 4/2019 | Bonilla et al. |
| 10,636,739 B2 | 4/2020 | Beyne et al. |
| 11,189,528 B2 | 11/2021 | Arnold et al. |
| 11,315,799 B2 | 4/2022 | Xie et al. |
| 2017/0012029 A1 | 1/2017 | Lambert et al. |
| 2018/0145030 A1 | 5/2018 | Beyne et al. |

(Continued)

*Primary Examiner* — Tu-Tu V Ho
(74) *Attorney, Agent, or Firm* — Kimberly Zillig

(57) ABSTRACT

A semiconductor device including an interleaved/nested structure of subtractive interconnects and damascene interconnects. The semiconductor device includes a subtractive-etched interconnect wiring level having subtractive interconnects and a damascene interconnect wiring level having damascene interconnects. The subtractive-etched interconnect wiring level includes first electrodes that have a first potential second electrodes that have a second potential different from the first potential, with the second electrodes generated to interleave the first electrodes. The semiconductor also includes a damascene interconnect wiring level that includes other first electrodes having the first potential, and other second electrodes having the second potential. In the damascene interconnect wiring level, the other second electrodes are also interleaved by the other first electrodes.

20 Claims, 8 Drawing Sheets

(56)               References Cited

U.S. PATENT DOCUMENTS

2020/0373242 A1     11/2020   Hiblot et al.
2022/0115317 A1     4/2022   Yang et al.

* cited by examiner

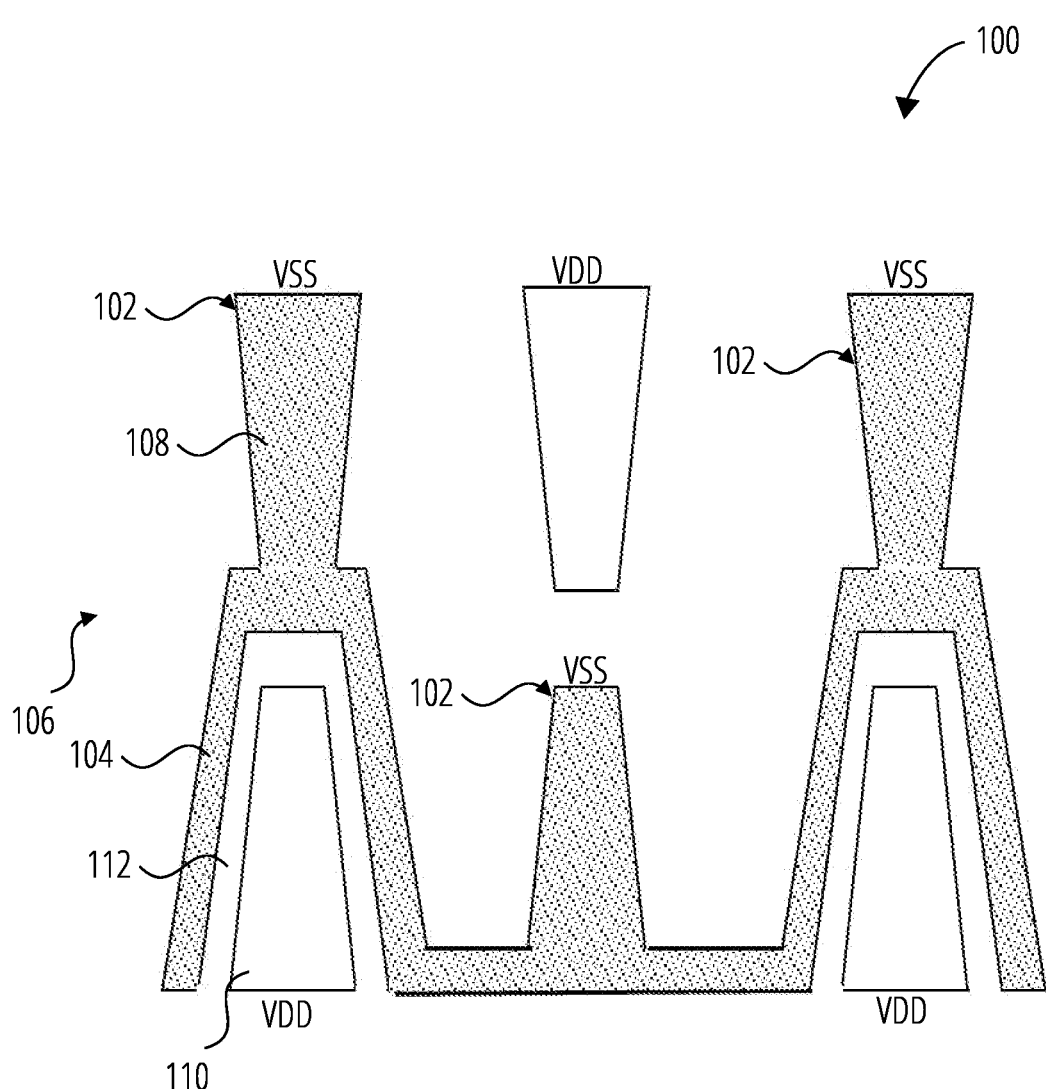
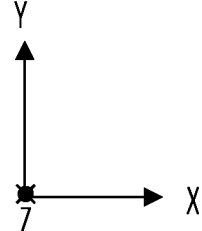
FIG. 1

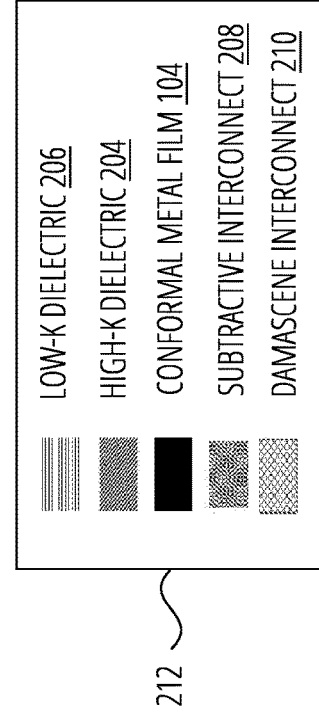
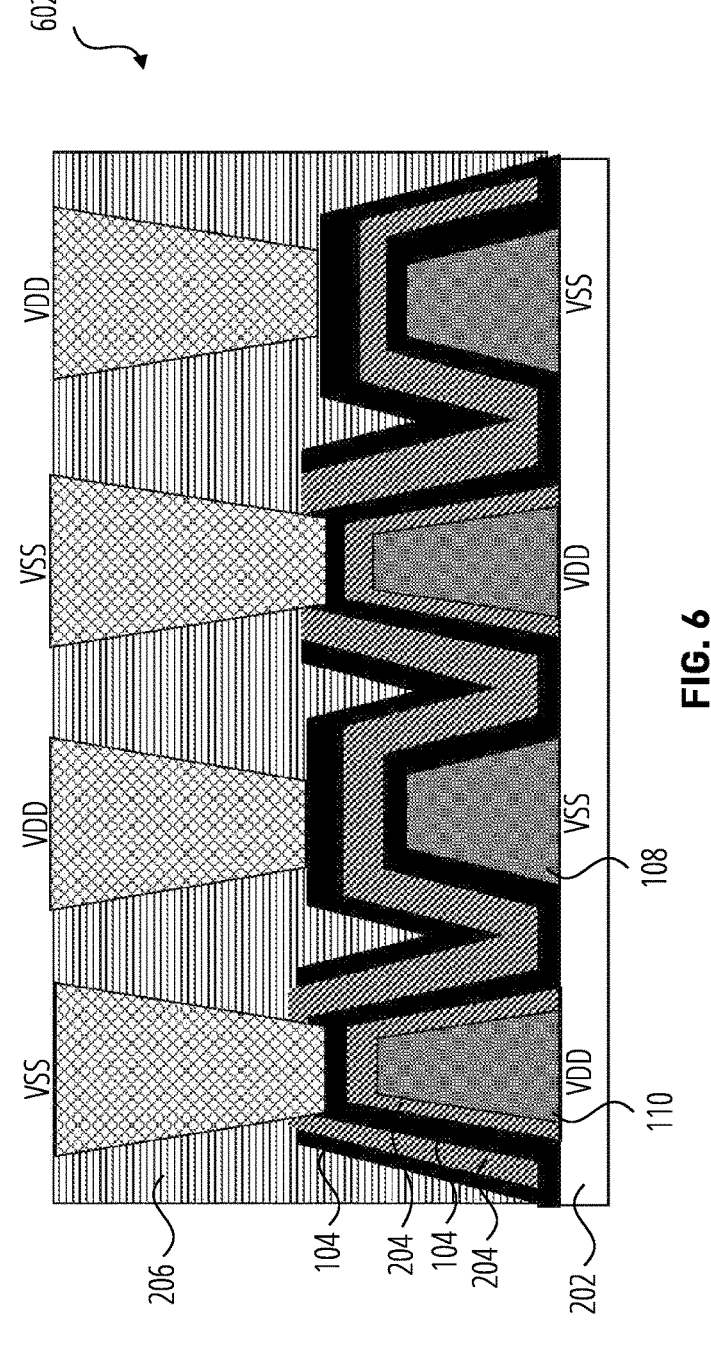
FIG. 6

700

```
┌─────────────────────────────────────────────────────────────┐
│              PROVIDE A SUBSTRATE 702                         │
└─────────────────────────────────────────────────────────────┘
                            ↓
┌─────────────────────────────────────────────────────────────┐
│ ETCH, BY SUBTRACTIVE LINE FORMATION, A SUBTRACTIVE-ETCHED    │
│ INTERCONNECT WIRING LEVEL ON THE SUBSTRATE; THE SUBTRACTIVE-ETCHED │
│ INTERCONNECT WIRING LEVEL COMPRISING A PLURALITY OF FIRST    │
│ ELECTRODES AND A PLURALITY OF SECOND ELECTRODES INTERLEAVING THE │
│ PLURALITY OF FIRST ELECTRODES 704                           │
└─────────────────────────────────────────────────────────────┘
                            ↓
┌─────────────────────────────────────────────────────────────┐
│ DISPOSE A DAMASCENE INTERCONNECT WIRING LEVEL ADJACENT AND   │
│ PARALLEL TO THE SUBTRACTIVE-ETCHED INTERCONNECT WIRING LEVEL, THE │
│ DAMASCENE INTERCONNECT WIRING LEVEL COMPRISING ANOTHER PLURALITY │
│ OF FIRST ELECTRODES AND ANOTHER PLURALITY OF SECOND ELECTRODES │
│ INTERLEAVING THE ANOTHER PLURALITY OF FIRST ELECTRODES 706  │
└─────────────────────────────────────────────────────────────┘
                            ↓
┌─────────────────────────────────────────────────────────────┐
│ APPLY A HIGH-K DIELECTRIC LAYER IN BETWEEN THE PLURALITY OF FIRST │
│ ELECTRODES IN THE SUBTRACTIVE-ETCHED INTERCONNECT WIRING LEVEL AND │
│ THE ANOTHER PLURALITY OF SECOND ELECTRODES IN THE DAMASCENE  │
│ INTERCONNECT WIRING LEVEL 708                               │
└─────────────────────────────────────────────────────────────┘
```

FIG. 7

NON-PLANAR METAL-INSULATOR-METAL STRUCTURE

BACKGROUND

Technical Field

The present disclosure generally relates to a semiconductor structure, and more particularly, to metal-insulator-metal (MIM) structures and methods of creation thereof.

Description of the Related Art

Millions of transistors and other circuit components may be manufactured on a single silicon crystal substrate to create an integrated circuit (IC) device (wafer). To connect the circuit parts dispersed throughout the surface of the wafer, some techniques may be used to create interconnection schemes, such as dual damascene wiring (interconnect structures) or wiring generated by subtractive etch. As critical dimensions decrease, it may be beneficial to optimize interconnection schemes through modifications to material usage and process flows to construct high-performance structures.

SUMMARY

According to an embodiment of the disclosure, a semiconductor device comprising a MIM (metal-insulator-metal) capacitor structure is provided.

In one embodiment, the semiconductor device comprises an interleaved/nested structure of subtractive interconnects and damascene interconnects. More specifically, the semiconductor device may comprise a subtractive-etched interconnect wiring level comprising subtractive interconnects and a damascene interconnect wiring level comprising damascene interconnects. The subtractive-etched interconnect wiring level may comprise a plurality of first electrodes that may comprise a first potential and a plurality of second electrodes that may comprise a second potential different from the first potential, with the plurality of second electrodes configured to interleave the plurality of first electrodes. The semiconductor may also comprise a damascene interconnect wiring level that comprises another plurality of first electrodes with the first potential, and another plurality of second electrodes with the second potential. In the damascene interconnect wiring level, the another plurality of second electrodes may also be interleaved by the another plurality of first electrodes.

According to another embodiment of the present disclosure, a method of creating a semiconductor is disclosed. The method may comprise providing a substrate and etching, by subtractive line formation, a subtractive-etched interconnect wiring level on the substrate, the subtractive-etched interconnect wiring level comprising a plurality of first electrodes with a first potential, and a plurality of second electrodes includes a second potential different from the first potential configured to interleave the plurality of first electrode. In the method, a damascene interconnect wiring level may be disposed adjacent to and parallel to the subtractive-etched interconnect wiring level, the damascene interconnect wiring level comprising another plurality of first electrodes with the first potential and another plurality of second electrodes with the second potential, the another plurality of second electrodes interleaving the another plurality of first electrodes. The method may further comprise applying a high-k dielectric layer in between the plurality of first electrodes in the subtractive-etched interconnect wiring level and the another plurality of second electrodes in the damascene interconnect wiring level.

According to one embodiment, the subtractive-etched interconnect wiring level may be disposed on the substrate and the damascene interconnect wiring level may be disposed above the subtractive-etched interconnect wiring level.

According to yet another embodiment, the semiconductor device may also comprise a conformal metal film disposed above the high-k dielectric layer and configured to conform to a shape of the plurality of first and second electrodes.

The techniques described herein may be implemented in a number of ways. Example implementations are provided below with reference to the following figures.

BRIEF DESCRIPTION OF THE DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all the components or steps that are illustrated. When the same numeral appears in different drawings, it refers to the same or like components or steps.

FIG. 1 depicts a cross sectional view of a semiconductor device in accordance with an illustrative embodiment.

FIG. 6 depicts a cross sectional view of a semiconductor device with a plurality of conformal metal films and dielectric layers in accordance with an illustrative embodiment.

FIG. 7 illustrates a process 700 in accordance with one embodiment.

DETAILED DESCRIPTION

Overview

Figure 2:
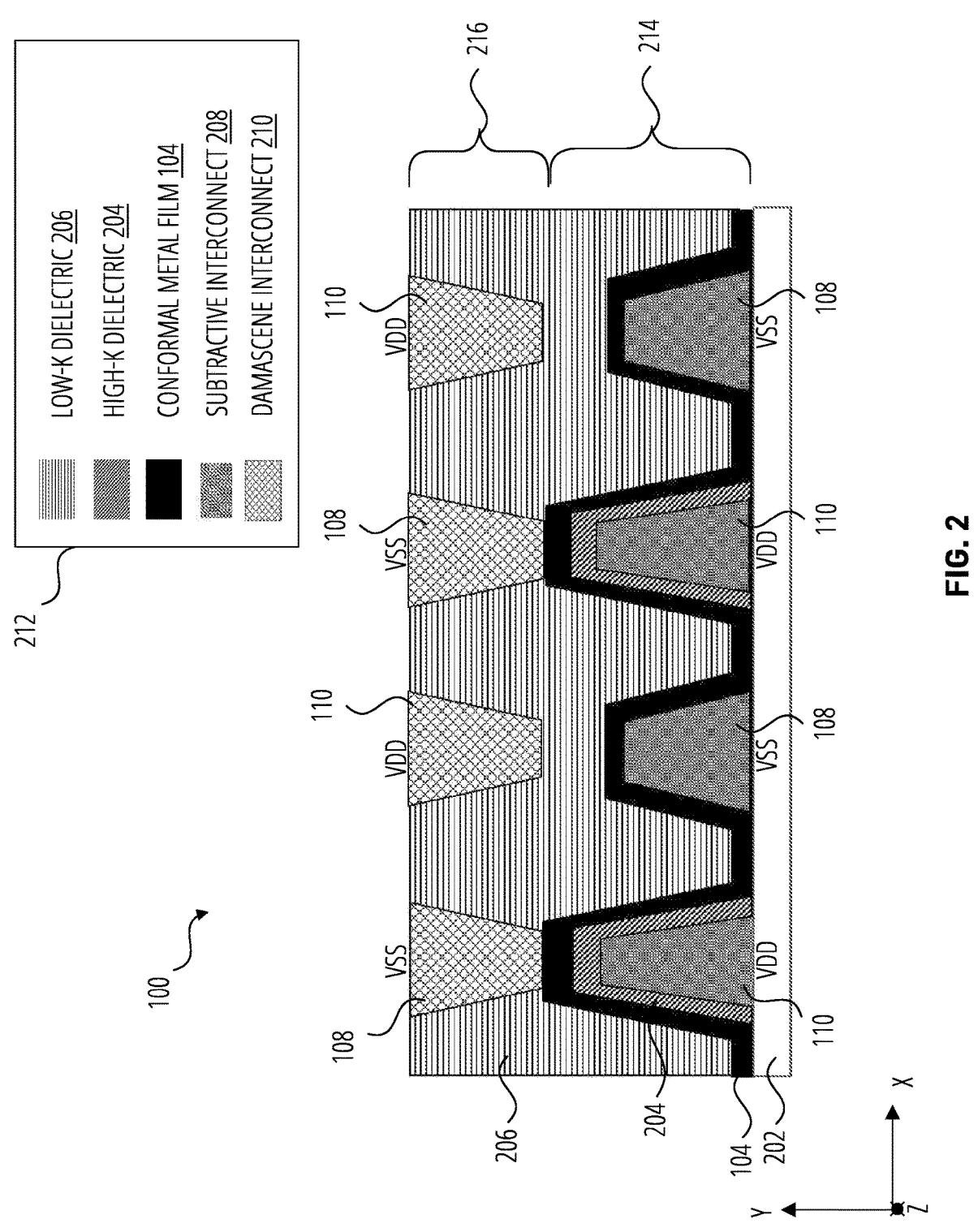
FIG. 2 depicts a cross sectional view of a semiconductor device with a conformal metal film in accordance with an illustrative embodiment.

In the following detailed description, numerous specific details are set forth by way of examples to provide a thorough understanding of the relevant teachings. However, it should be apparent that the present teachings may be practiced without such details. In other instances, well-known methods, procedures, components, and/or circuitry have been described at a relatively high-level, without detail, to avoid unnecessarily obscuring aspects of the present teachings.

In one aspect, spatially related terminology such as "front," "back," "top," "bottom," "beneath," "below," "lower," "above," "upper," "side," "left," "right," and the like, is used with reference to the orientation of the Figures being described. Since components of embodiments of the disclosure can be positioned in a number of different orientations, the directional terminology is used for purposes of illustration and is in no way limiting. Thus, it will be understood that the spatially relative terminology is intended to encompass different orientations of the device in use or operation in addition to the orientation depicted in the figures. For example, if the device in the figures is turned over, elements described as "below", or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

As used herein, the terms "lateral" and "horizontal" describe an orientation parallel to a first surface of a chip.

As used herein, the term "vertical" describes an orientation that is arranged perpendicular to the first surface of a chip, chip carrier, or semiconductor body.

As used herein, the terms "coupled" and/or "electrically coupled" are not meant to mean that the elements must be directly coupled together—intervening elements may be provided between the "coupled" or "electrically coupled" elements. In contrast, if an element is referred to as being "directly connected" or "directly coupled" to another element, there are no intervening elements present. The term "electrically connected" refers to a low-ohmic electric connection between the elements electrically connected together.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

Example embodiments are described herein with reference to cross-sectional illustrations that are schematic illustrations of idealized or simplified embodiments (and intermediate structures). As such, variations from the shapes of the illustrations as a result, for example, of manufacturing techniques and/or tolerances, may be expected. Thus, the regions illustrated in the figures are schematic in nature and their shapes do not necessarily illustrate the actual shape of a region of a device and do not limit the scope.

It is to be understood that other embodiments may be used, and structural or logical changes may be made without departing from the spirit and scope defined by the claims. The description of the embodiments is not limiting. In particular, elements of the embodiments described hereinafter may be combined with elements of different embodiments.

The concepts herein relate to wafers with back-side power delivery. The illustrative embodiments recognize that the designing high-performance integrated circuit chips may comprise getting current to the billions of transistors. As transistors get smaller and smaller, the interconnects that deliver current to the transistors may also get smaller and closer together, increasing resistance and power loss. Passage of electrons from a source to the transistors that use them for computation may be complex. The electrons may move along copper traces of a printed circuit board into a package that houses the integrated circuit chip, through the solder balls connecting the chip to the packaging, and then via on-chip interconnects to the transistors. The illustrative embodiments recognize that the movement via on-chip interconnects may be crucial. A high-quality, crystalline silicon substrate may be the first component of an integrated circuit ship. At the top of that silicon, a first layer of transistors may be designed. These may be connected using metal interconnects to create circuits with practical computing capabilities. It may take a plurality (e.g., 10-20) of layered stack of these interconnects to supply power, via power lines and data, via signal lines to the billions of transistors. Those layers closest to the silicon transistors may be thin and small to connect to the relatively small transistors, but they may grow in size as the stack level increases. Because they have less resistance, these levels with wider interconnects may be superior at delivering power. Thus, the metal that may power the circuit—the power delivery network—may be on top of the transistors in a front-side power delivery architecture. The power network and the network of interconnects used to deliver signals in a front-side power delivery architecture may share the same resources and thus may compete for space. Electrons may travel through 10 to 20 layers of progressively thinner and more twisted metal before eventually passing through to the very last layer of local wires to reach a transistor. This process may be very lossy as power may be lost along the electron travel path.

The illustrative embodiments recognize that by exploiting the back side of the chip, power connections may be built below the wafer, in a back-side power delivery architecture instead of above them, thereby creating larger, less resistant rails and freeing space for signal-carrying interconnects on the front side of the wafer.

Further, physical separation of the backside power delivery network from the signal network may mean that the two networks are no longer in direct competition for the same metal-layer resources. Additionally, the preferred metal layer qualities for signal routes (thin and narrow so they can make circuits from densely packed transistors) and power routes (thick and wide for low resistance) no longer need to be compromised. Both the front-side metal layers and the back-side metal layers may be tuned simultaneously for power routing.

The illustrative embodiments further recognize that metal-insulator-metal (MIM) capacitors may be used throughout circuit designs to provide integrated capacitors that may be formed during semiconductor fabrication processes instead of using discrete capacitors on circuit board. A capacitor may include a stack that comprises a first metallic layer formed over a substrate, an insulator formed over the first metallic layer, and a second metallic layer formed over the insulator. In one aspect, the illustrative embodiments disclose a MIM capacitor constructed on the back side of a wafer, thereby preventing space competition with signal lines or architectures that compromise on optimal route design. The back side of the wafer may comprise power and ground lines, which may allow the construction of unique electrical connections between different levels of wiring, which allows the formation of a MIM capacitor, in particular, a non-planar MIM capacitor as described herein.

Example Architecture

FIG. 1 illustrates a cross-sectional view of a semiconductor device 100 comprising a 3D (three-dimensional)/non-planar MIM capacitor 106 on a backside of a chip. The non-planar MIM capacitor 106 may be located on both a via and line region with no signal lines and with the first electrode 110 and second electrode 108 being nested therein. The non-planar MIM capacitor 106 may comprise a first metallic layer formed by the first electrode 110 (for example power/VDD metal lines, though this is not meant to be limiting), a second metallic layer formed by the conformal metal film 104 and a dielectric 112 disposed therebetween. The conformal metal film 104 may be electrically connected to the second electrode 108 (for example, ground/negative/VSS metal lines, though this is not meant to be limiting) to form interconnect lines 102 that may run in the Z direction as shown in FIG. 1. Thus, the conformal metal film may be connected to and at the same potential as (i) the plurality of first electrodes and the another plurality of first electrodes or (ii) the plurality of second electrodes and the another plurality of second electrodes.

The configuration of the conformal metal film running in the Z direction and conforming to a shape of the first electrode 110 and dielectric 112 disposed therebetween may effectively create a capacitor structure, in particular a non-planar MIM capacitor 106. Thus, there may be a dielectric insulating the VDDs from the VSSs. Further a combination of damascene and subtractive lines/vias may be present in the region as discussed herein. In a damascene process, a patterned metal layer may be formed on and in another dielectric layer such that the top surfaces of the two layers are coplanar. In a subtractive etching process, metal layers may be chemically removed from the surface of a wafer during manufacturing. For example, portions of the wafer may be protected from an etchant by a "masking" material that has been patterned to resist etching.

In one aspect, as shown in FIG. 2, the semiconductor device comprises an interleaved/nested structure of subtractive interconnects 208 and damascene interconnects 210. Legend 212 is a legend illustrating components of the semiconductor device 100. More specifically, the semiconductor device comprises a first interconnect wiring level and a second interconnect wiring level. The first interconnect wiring level may be a subtractive-etched interconnect wiring level 214 comprising subtractive interconnects 208 disposed on the substrate 202. The semiconductor device 100 may also include a damascene interconnect wiring level 216 as the second interconnect wiring level that may comprise damascene interconnects 210 that may be disposed above the subtractive-etched interconnect wiring level. The damascene interconnects 210 may comprise, for example, copper. The subtractive-etched interconnect wiring level may comprise a plurality of first electrodes 110 that may comprise a first potential. The semiconductor device may also comprise a plurality of second electrodes 108 that may comprise a second potential different from the first potential. The plurality of second electrodes 108 may interleave the plurality of first electrodes 110, for example, in a 1:1 alternating pattern wherein 1:1 represents one first electrode adjacent to one second electrode in a repeating fashion. The interleaving may thus, comprise alternating in the same level, electrodes or metal lines having a first potential with electrodes or metal lines having the second potential. Of course, other interleaving patterns may be obtained based on the configuration of VDD and VSS lines such as a 1:2 alternating pattern of one first electrode adjacent to two second electrodes wherein the two second electrodes are two negative lines and the one first electrode is a power line. In other embodiments, there may be multiple VSS lines in between VDD lines, and/or vice versa.

Prior to next line formation of the damascene interconnect wiring level 216, a dielectric backfill may be performed to dispose a low-k dielectric 206 on the subtractive-etched interconnect wiring level 214. A low-k dielectric may have a k-value less than that of SiO2 (k=4.1). For example, a low-k dielectric may have a k~2.7. Thus, the low-k dielectric 206 may be configured to separate the subtractive-etched interconnect wiring level from the damascene interconnect wiring level. More generally, the backfilled material may be a low-k dielectric or any other insulating material. For backside power delivery, it may even be possible to backfill with a higher-k material (such as a nitride). This may increase decoupling capacitance between VDD and VSS.

The damascene interconnect wiring level 216 may comprise another plurality of first electrodes 110 that comprise the first potential, and another plurality of second electrodes 108 that comprise the second potential. The damascene interconnect wiring level 216 may run parallel to the subtractive-etched interconnect wiring level 214. In the damascene interconnect wiring level 216 the another plurality of second electrodes 108 may also be interleaved by the another plurality of first electrodes 110 in a similar pattern. In an aspect, due to an interleaving configuration, each electrode of the another plurality of second electrodes 108 in the damascene interconnect wiring level 216 may be disposed vertically above (in the Y-direction) and adjacent (in the Y-direction) to a first electrode of the plurality of first electrodes 110 in the subtractive-etched interconnect wiring level 214. Likewise, each electrode of the another plurality of first electrodes 110 in the damascene interconnect wiring level 216 may be disposed vertically above (in the Y-direction) and adjacent (in the Y-direction) to a second electrode of the plurality of second electrodes 108 in the subtractive-etched interconnect wiring level 214.

A spacer/high-k (high dielectric constant) dielectric layer 204 (high relative to that of a low-k dielectric 206) may be disposed between the plurality of first electrodes 110 in the subtractive-etched interconnect wiring level 214 and the another plurality of second electrodes 108 in the damascene interconnect wiring level 216. In some embodiments, the high-k dielectric 204 may be disposed on all subtractive interconnects 208 in the subtractive-etched interconnect wiring level 214 whereas in other embodiments, such as in FIG. 2, the high-k dielectric 204 may be disposed on the first electrodes 110 in the subtractive-etched interconnect wiring level 214. Spacer deposition on alternating lines may require masking, for example, the second electrodes 108 (VSS lines) and uniformly and reliably depositing the spacer around the first electrodes 110 (VDD lines). The deposition may be performed to completely electrically insulate the first electrodes 110 from the conformal metal film 104 and etching may have to be precisely controlled so that the first electrodes 110 lines do not extend too deep to short with the conformal metal film 104 and cause chip failure. Further, the spacer may be configured to be robust enough to prevent the conformal metal film 104 from shorting to the first electrodes 110 or any line that is being protected by the spacer. One may recognize that achieving this is a significant undertaking.

The configuration of FIG. 2 may form a power delivery network which may be built on the backside of a wafer. This may enable flexibility of design due to the elimination of competition for wiring resources and may allow the fabrication of unique electrical connections between different levels of wiring which in turn may form the non-planar MIM capacitor 106. Using a MIM capacitor on a chip may reduce power supply noise for the chip which may improve reliability. This may be due to the prevention of noise spikes that may cause electromagnetic failure. Implementing a MIM capacitor on a backside power delivery network may provide additional decoupling capacitance without additional design compromises since the way backside interconnect lines are built may be modified to provide an increase in decoupling capacitance.

Of course, the examples structures discussed are not meant to be limiting as other alternative structures may be obtained in view of the descriptions presented herein. For example, the damascene interconnect wiring level may be disposed on the substrate and the subtractive-etched interconnect wiring level may be disposed above the damascene interconnect wiring level.

Figure 3:
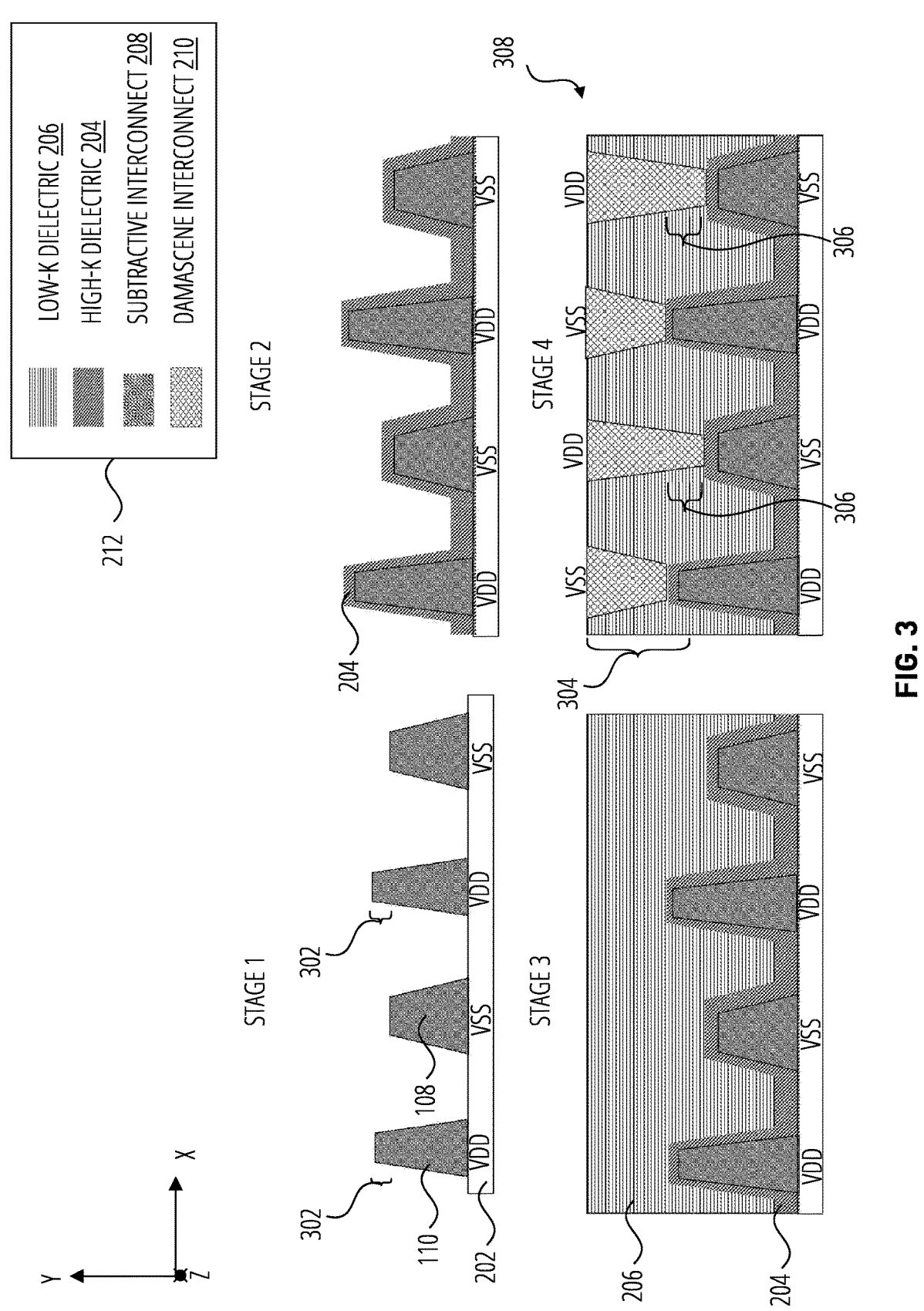
FIG. 3 depicts a cross sectional view of stages of a semiconductor device production without an integrated conformal metal film in accordance with an illustrative embodiment.

Turning now to FIG. 3, stages of manufacturing a first semiconductor device 308 are illustrated. In a first stage, a subtractive line formation of subtractive interconnects 208 may be performed on a backside of a wafer. The subtractive interconnects 208 in the subtractive-etched interconnect wiring level 214 may comprise top vias 302 on alternating lines (that is, for example, top vias on the first electrodes 110 in the subtractive-etched interconnect wiring level). The top vias may be formed subtractively directly above subtractively-formed lines. In a second stage, a conformal high-k dielectric 204 may be deposited on the subtractive interconnects 208. A dielectric backfill may follow in a third stage wherein the low-k dielectric 206 may be disposed on top of the high-k dielectric 204. The fourth stage may comprise next level line formation 304, that is, formation of the damascene interconnects 210 through a damascene process. The damascene interconnects 210 may comprise damascene vias 306 on alternating lines (that is damascene vias of the first electrodes 110 in the damascene interconnect wiring level 216). The damascene vias may be etched below a damascene line. In FIG. 3, the damascene lines may have the same bottom Z-coordinate, but the vias present on alternating lines may make make them appear to be "deeper" with a lower Z-coordinate. Of course, since the first semiconductor device 308 does not have a conformal metal film 104, other configurations of the first semiconductor device 308 may be obtained wherein the heights of the first electrodes 110 and the second electrodes 108 in both levels may be the same or substantially the same.

Figure 4:
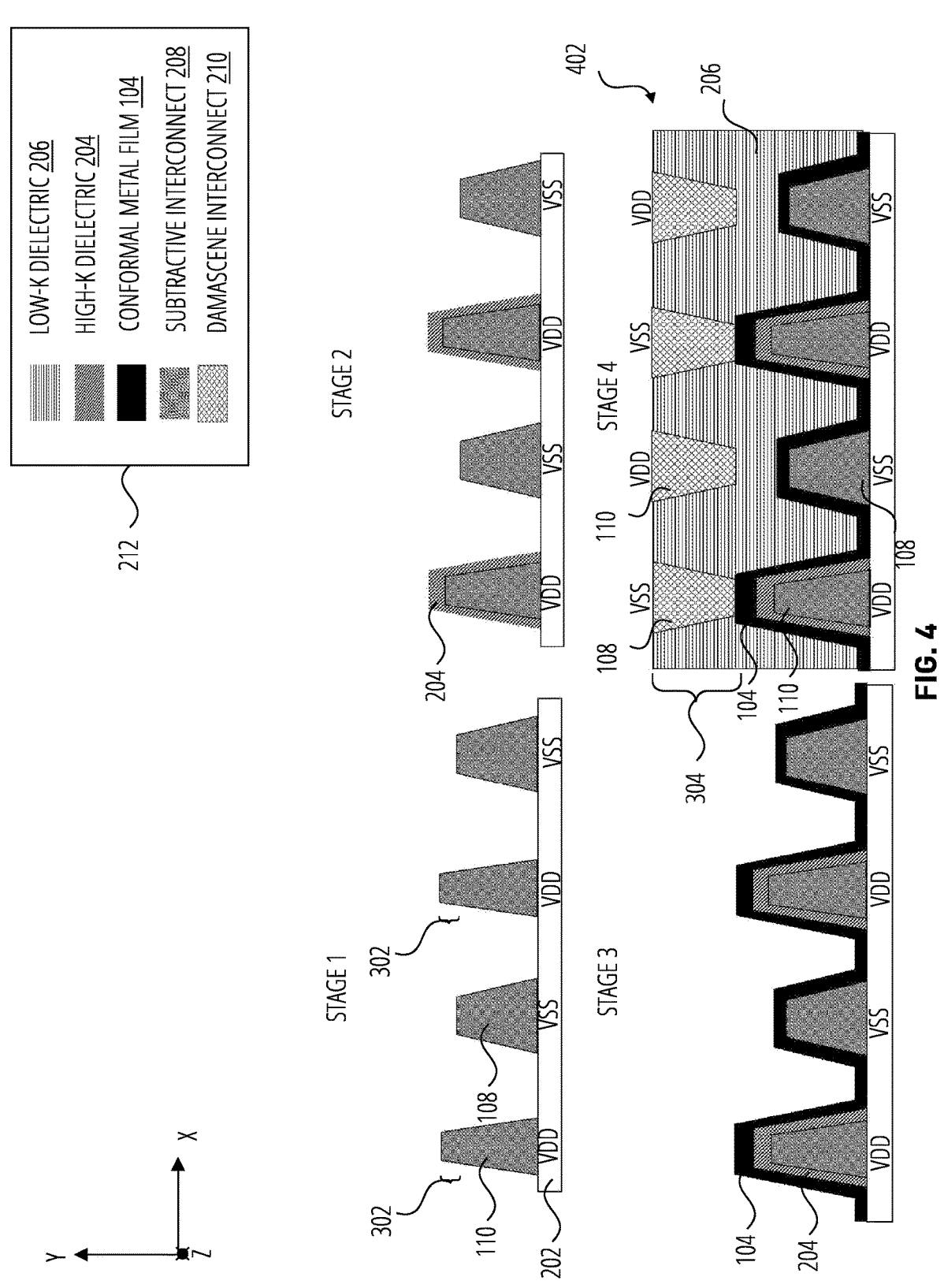
FIG. 4 depicts a cross sectional view of stages of a semiconductor device production with an integrated conformal metal film in accordance with an illustrative embodiment.

Turning now to FIG. 4, stages of manufacturing a second semiconductor device 402 are illustrated. In a first stage, a subtractive line formation of subtractive interconnects 208 may be performed on a backside of a wafer. The subtractive interconnects 208 in the subtractive-etched interconnect wiring level 214 may comprise top vias 302 on alternating lines (that is, for example, top vias on the first electrodes 110 in the subtractive-etched interconnect wiring level). In a second stage, a conformal high-k dielectric 204 or spacer may be selectively deposited on a subset of the subtractive interconnects 208. More specifically, the high-k dielectric 204 may be deposited on alternating lines, i.e., on the first electrodes 110. This may comprise a masking step. For example, the VSS lines may be masked so that the dielectric 204 is deposited on the VDD lines (110). Alternately, the VDD lines may be masked so that dielectric 204 is deposited only on VSS lines (108). The third stage may comprise depositing the conformal metal film 104 on the subtractive interconnects 208 and the high-k dielectrics 204. A dielectric backfill, using the low-k dielectric 206, may follow in the fourth stage wherein the low-k dielectric 206 may be disposed on top of the conformal metal film 104. A next level line formation 304 of the damascene interconnect wiring level 216, may be performed through a damascene process. The damascene interconnects 210 may be of a same height or of substantially the same height (in the Y-direction) in this example. By incorporating the top vias 302 in the first electrodes 110 of the subtractive-etched interconnect wiring level 214 in the first stage and not incorporating damascene vias in the first electrodes 110 of the damascene interconnect wiring level 216 in the fourth stage, shorting of the first electrodes 110 of the damascene interconnect wiring level with the conformal metal film 104 may be prevented. One may keep a distance between VDD and VSS interconnects at least 10 nm. This dimensioning may be achieved based on the thickness of the deposited dielectric and may prevent shorting.

Figure 5:
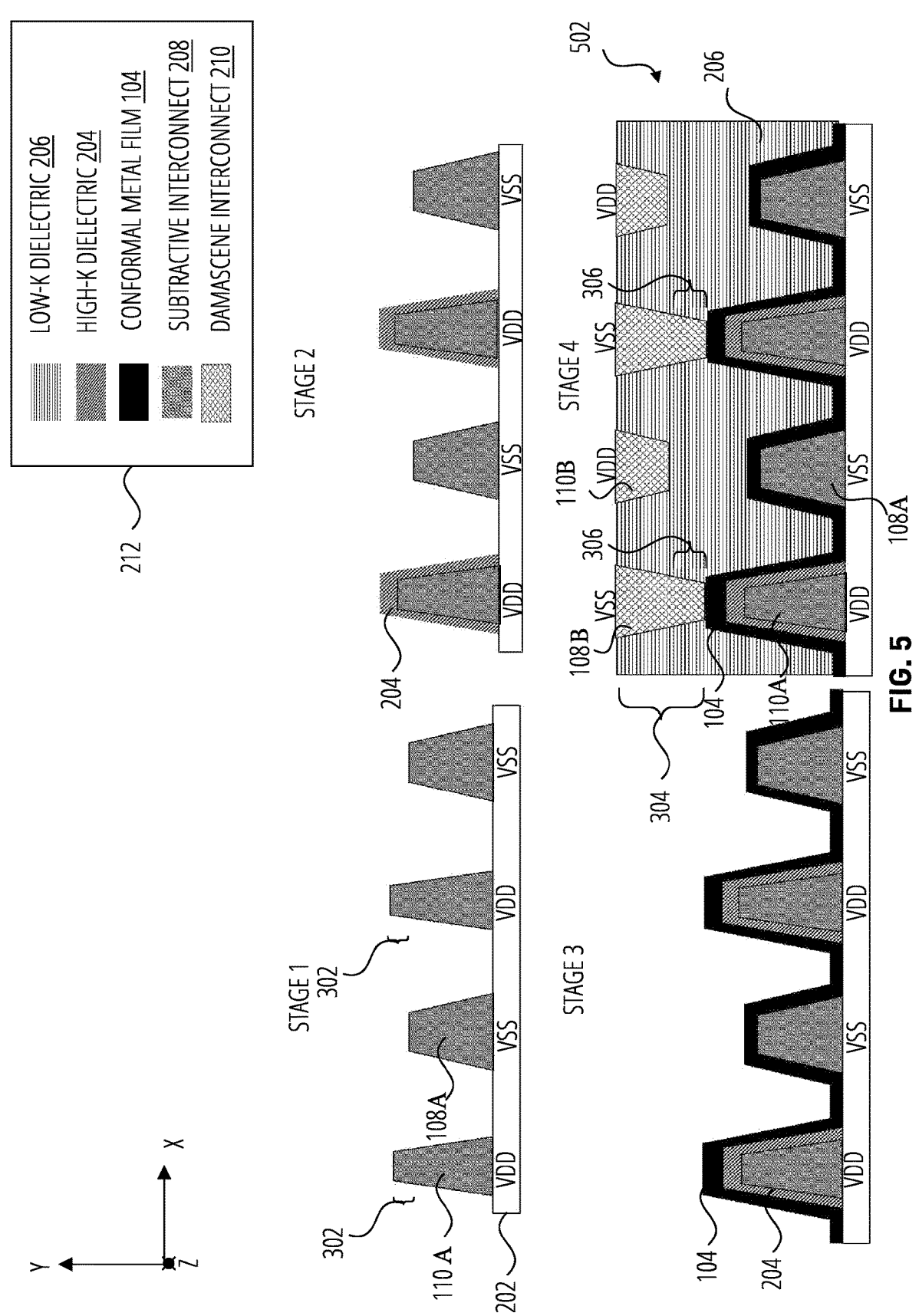
FIG. 5 depicts a cross sectional view of stages of a semiconductor device production with an integrated damascene vias in accordance with an illustrative embodiment.

Turning now to FIG. 5, stages of manufacturing a third semiconductor device 502 are illustrated. In a first stage, a subtractive line formation of subtractive interconnects 208 may be performed on a backside of a wafer. The subtractive interconnects 208 in the subtractive-etched interconnect wiring level 214 may comprise top vias 302 on alternating lines (that is, for example, top vias on the first electrodes 110A in the subtractive-etched interconnect wiring level and no top vias on the second electrodes 108A in the subtractive-etched interconnect wiring level). In a second stage, a conformal high-k dielectric 204 or spacer may be selectively deposited on a subset of the subtractive interconnects 208. More specifically, the high-k dielectric 204 may be selectively deposited conformally on alternating lines, i.e., on the first electrodes 110A. This may comprise a masking step. The third stage may comprise depositing the conformal metal film 104 on the subtractive interconnects 208 and the high-k dielectrics 204. A dielectric backfill, using the low-k dielectric 206, may follow in the fourth stage wherein the low-k dielectric 206 may be disposed on top of the conformal metal film 104. A next level line formation 304, that is, formation of the damascene interconnects 210 may be performed through a damascene process. The second electrodes 108B of the damascene interconnect wiring level 216 may comprise damascene vias 306. Thus, a height of the second electrodes 108B in the damascene interconnect wiring level 216 and first electrodes 110B in the damascene interconnect wiring level 216 may be different. By incorporating the top vias in the first electrodes 110A of the subtractive-etched interconnect wiring level 214 in the first stage and also incorporating damascene vias in the second electrodes 108B of the damascene interconnect wiring level 216, shorting of the first electrodes 110B in the damascene interconnect wiring level with the conformal metal film 104 may be prevented.

FIG. 6 shows a fourth semiconductor device 602 comprising a plurality of conformal metal films 104 interleaved (such as in an alternating pattern) by a plurality of high-k dielectrics 204, where one or more of the plurality of high-k dielectrics 204 are selectively opened to electrically couple a first electrode with a first conformal metal film. As shown in the figure, there is spacer-metal-spacer-metal-spacer-metal layer between a first electrode 110 in the subtractive-etched interconnect wiring level 214 and an adjacent (in the X-direction) second electrode 108 in the subtractive-etched interconnect wiring level 214. Thus, several levels of metal-insulator-metal sequences may be formed by this and similar configurations, a by-product of which may be significantly more decoupling capacitance. A process of forming the fourth semiconductor device 602 may comprise a same process flow as that of the third semiconductor device 502 but with three options to make VSS line-to-sheet/conformal metal film contact. A first option may comprise using a mask to etch away a top conformal metal film 104 off VDD lines. More specifically, the VSS lines in the subtractive etched wiring level may be masked and the top conformal metal film may be etched away on top of the VDD lines. Thus, the upper VSS lines above may make electrical contact with the lower conformal metal layer while the upper VDD lines make contact with the upper conformal metal layer (avoiding VDD-to-VSS shorts.) A second option may comprise etching vias and depositing a sidewall spacer and inner spacer to isotropically lateral etch the conformal metal film and fill with spacer. More specifically, the vias may be etched using two masks. The first mask may form vias at all desired locations, which may result in VDD-to-VDD connections, VS S-to-VS S connections and undesired VDD-to-VSS connections. The undesired VDD-to-VSS connections may be gotten rid of by using a second mask to mask off the desirable vias, and then the undesired vias may have their conformal metal selectively removed and filled with dielectric, thereby protecting VDD from VSS. A third option may comprise using a CMP to remove the top conformal metal film off of the VDD lines, and then etching through the remaining high-k dielectric. More specifically, a CMP (Chemical mechanical planarization) step can be performed to remove the top-most portion of the conformal metal everywhere, and then a mask may be used to etch through the dielectric where VDD-to-VDD connections are desired or where VSS-to-VSS connections are desired.

Turning now to FIG. 7, a process 700 of manufacturing a semiconductor device 100 is shown. The process 700 may be performed, for example, using a connectivity engine such as the connectivity engine 818 of FIG. 8. In step 702, a substrate may be provided. In step 704, connectivity engine 818 may cause a process module such as process module 820 to etch, by subtractive line formation, a subtractive-etched interconnect wiring level on the substrate; the subtractive-etched interconnect wiring level comprising a plurality of first electrodes comprising a first potential, and a plurality of second electrodes comprising a second potential different from the first potential and interleaving the plurality of first electrodes. In step 706, connectivity engine 818 may cause process module 820 to disposes a damascene interconnect wiring level adjacent (in the Y-direction) and parallel to the subtractive-etched interconnect wiring level, the damascene interconnect wiring level comprising another plurality of first electrodes with the first potential and another plurality of second electrodes with the second potential, the another plurality of second electrodes interleaving the another plurality of first electrodes. In step 708, process module 820 may apply a high-k dielectric layer in between the plurality of first electrodes in the subtractive-etched interconnect wiring level and the another plurality of second electrodes in the damascene interconnect wiring level.

The process module 820 may further apply a conformal metal film to the plurality of first and second electrodes in the damascene interconnect wiring level, the conformal metal film conforming to a shape of the plurality of first and second electrodes. The process module 820 may also connect the conformal metal film to a set of electrodes to share a same potential, the set of electrodes being (i) the plurality of first electrodes and the another plurality of first electrodes or (ii) the plurality of second electrodes and the another plurality of second electrodes. Other technical features may be readily apparent to one skilled in the art from the figures, descriptions, and claims herein.

While the manufacture of a various architectures of non-planar MIM capacitors are described for the purposes of the discussion, it will be understood that other configurations, as well as those having multiple layers and arrangements are supported by the teachings herein.

In one aspect, the method and structures as described above may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip may be mounted in a single chip package (such as a plastic carrier, with leads that are affixed to a motherboard or other higher-level carrier) or in a multichip package (such as a ceramic carrier that has either or both surface interconnections or buried interconnections). In any case, the chip can then be integrated with other chips, discrete circuit elements, and/or other signal processing devices as part of either (a) an intermediate product, such as a motherboard, or (b) an end product. The end product can be any product that includes integrated circuit chips, ranging from low-end applications, such as toys, to advanced computer products having a display, a keyboard or other input device, and a central processor.

Example Computer Platform

Figure 8:
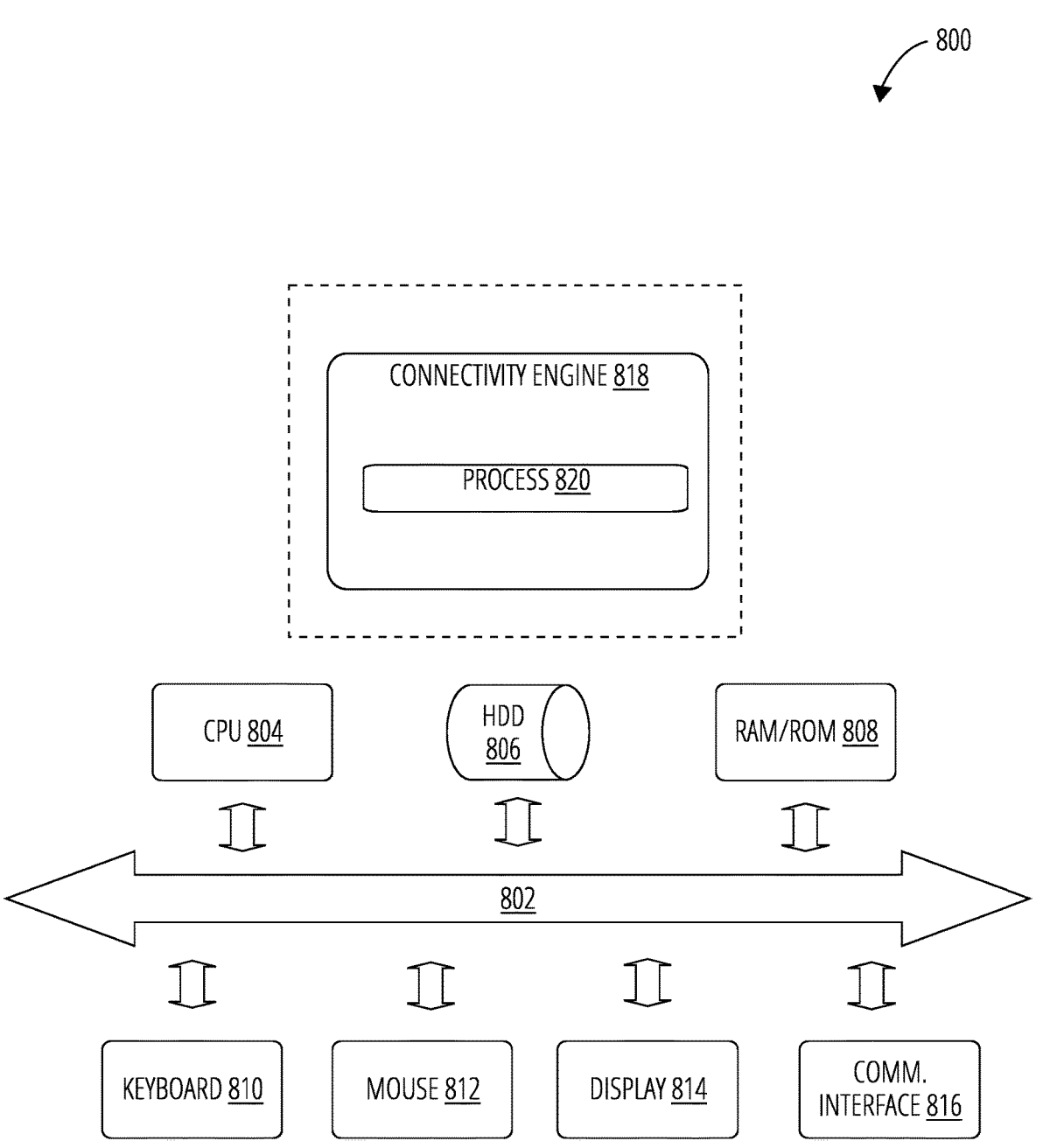
FIG. 8 illustrates an aspect of the subject matter in accordance with one embodiment.

As discussed above, functions relating to methods and systems for providing non-planar MIM devices can use of one or more computing devices connected for data communication via wireless or wired communication. FIG. 8 is a functional block diagram illustration of a computer hardware platform that can be used to control various aspects of a suitable computing environment in which the process discussed herein can be controlled. While a single computing device is illustrated for simplicity, it will be understood that a combination of additional computing devices, program modules, and/or combination of hardware and software can be used as well. The computer platform 800 may include a central processing unit (CPU) 804, a hard disk drive (HDD) 806, random access memory (RAM) and/or read only memory (ROM) 808, a keyboard 810, a mouse 812, a display 814, and a communication interface 816, which are connected to a system bus 802.

In one embodiment, the hard disk drive (HDD) 806, has capabilities that include storing a program that can execute various processes, such as the connectivity engine 818, in a manner described herein. The connectivity engine 818 may have various modules configured to perform different functions. For example, there may be a process module 820 configured to control the different manufacturing processes discussed herein and others.

CONCLUSION

The descriptions of the various embodiments of the present teachings have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

While the foregoing has described what are considered to be the best state and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

The components, steps, features, objects, benefits and advantages that have been discussed herein are merely illustrative. None of them, nor the discussions relating to them, are intended to limit the scope of protection. While various advantages have been discussed herein, it will be understood that not all embodiments necessarily include all advantages. Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

Numerous other embodiments are also contemplated. These include embodiments that have fewer, additional, and/or different components, steps, features, objects, benefits and advantages. These also include embodiments in which the components and/or steps are arranged and/or ordered differently.

While the foregoing has been described in conjunction with exemplary embodiments, it is understood that the term "exemplary" is merely meant as an example, rather than the best or optimal. Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments have more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

What is claimed is:

1. A semiconductor device comprising:
    a substrate;
    a first interconnect wiring level comprising:

a first plurality of first electrodes configured to carry a first potential; and
    a first plurality of second electrodes configured to carry a second potential different from the first potential and interleaving the first plurality of first electrodes, the first plurality of first electrodes and the first plurality of second electrodes having subtractive interconnects; and
    a second interconnect wiring level comprising:
    a second plurality of first electrodes configured to carry the first potential; and
    a second plurality of second electrodes configured to carry the second potential;
    the second plurality of second electrodes being interleaved by the second plurality of first electrodes, the second plurality of first electrodes and the second plurality of second electrodes form damascene interconnects;
    wherein a high-k dielectric layer is disposed between the first plurality of first electrodes in the first interconnect wiring level and the second plurality of second electrodes in the second interconnect wiring level.

2. The semiconductor device of claim 1, wherein the first interconnect wiring level is a subtractive-etched interconnect wiring level and the second interconnect wiring level is a damascene interconnect wiring level.

3. The semiconductor device of claim 1, wherein the first interconnect wiring level is disposed on the substrate and the second interconnect wiring level is disposed above the first interconnect wiring level.

4. The semiconductor device of claim 3, wherein each electrode of the second plurality of second electrodes is disposed vertically above and adjacent, in a Y-direction, to a first electrode of the first plurality of first electrodes.

5. The semiconductor device of claim 3, wherein each electrode of the second plurality of first electrodes is disposed vertically above and adjacent, in a Y-direction, to a second electrode of the first plurality of second electrodes.

6. The semiconductor device of claim 1, wherein the second interconnect wiring level is disposed on the substrate and the first interconnect wiring level is disposed above the second interconnect wiring level.

7. The semiconductor device of claim 1, further comprising:
    a conformal metal film disposed above the high-k dielectric layer and conforming to a shape of the subtractive interconnects.

8. The semiconductor device of claim 7, wherein the conformal metal film is connected to and at the same potential as (i) the first plurality of first electrodes and the second plurality of first electrodes or (ii) the first plurality of second electrodes and the second plurality of second electrodes.

9. The semiconductor device of claim 7, further comprising:
    a plurality of conformal metal films interleaved by a plurality of high-k dielectric layers,
    wherein one or more of the plurality of high-k dielectric layers are selectively opened to electrically couple a first electrode with a first conformal metal film.

10. The semiconductor device of claim 7, wherein the conformal metal film is non-planar.

11. The semiconductor device of claim 1, wherein a low-k dielectric layer configured to separate the first interconnect wiring level from the second interconnect wiring level.

12. The semiconductor device of claim 1, wherein one or more vias are configured in one or more electrodes, such that a height of the one or more electrodes is different from another height of another one or more electrodes.

13. The semiconductor device of claim 12, wherein the one or more vias are damascene vias or top-vias.

14. The semiconductor device of claim 1, wherein the first and second plurality of first electrodes are power lines and the first and second plurality of second electrodes are ground lines.

15. The semiconductor device of claim 1, wherein the semiconductor device is configured to provide a backside power delivery.

16. A method comprising:

providing a substrate;

etching, by subtractive line formation, a first interconnect wiring level on the substrate; the first interconnect wiring level comprising a first plurality of first electrodes configured to carry a first potential, and a first plurality of second electrodes configured to carry a second potential different from the first potential and interleaving the first plurality of first electrodes;

disposing a second interconnect wiring level adjacent and parallel to the first interconnect wiring level, the second interconnect wiring level comprising a second plurality of first electrodes with the first potential and a second plurality of second electrodes with the second potential, the second plurality of second electrodes interleaving the second plurality of first electrodes; and applying a high-k dielectric layer in between the first plurality of first electrodes in the first interconnect wiring level and the second plurality of second electrodes in the second interconnect wiring level.

17. The method of claim 16, further comprising:

disposing the first interconnect wiring level is on the substrate and the second electrode above the first interconnect wiring level.

18. The method of claim 16, further comprising:

applying a conformal metal film to the first plurality of first electrodes and first plurality of second electrodes, the conformal metal film conforming to a shape of the first plurality of first electrodes and first plurality of second electrodes.

19. The method of claim 18, further comprising:

connecting the conformal metal film to a set of electrodes to share a same potential, the set of electrodes being (i) the first plurality of first electrodes and the second plurality of first electrodes or (ii) the first plurality of second electrodes and the second plurality of second electrodes.

20. The method of claim 16, wherein the first interconnect wiring level is a subtractive-etched interconnect wiring level and the second interconnect wiring level is a damascene interconnect wiring level.

* * * * *